(12) United States Patent
Im et al.

(10) Patent No.: US 11,496,019 B2
(45) Date of Patent: Nov. 8, 2022

(54) WATERPROOF WITH INVERTER HOUSING HAVING CONNECTOR MOUNTING PORTION FOR ACCOMMODATING SEALING MEMBERS

(71) Applicant: Hanon Systems, Daejeon (KR)

(72) Inventors: Ho Bin Im, Daejeon (KR); Ho Youn Kim, Daejeon (KR); Hyeon Jae Shin, Daejeon (KR); Jae Won Lee, Daejeon (KR); Kyung Hun Jung, Daejeon (KR); Seong Kook Cho, Daejeon (KR)

(73) Assignee: Hanon Systems, Daejeon (KR)

( * ) Notice: Subject to any disclaimer, the term of this patent is extended or adjusted under 35 U.S.C. 154(b) by 655 days.

(21) Appl. No.: 16/536,453

(22) Filed: Aug. 9, 2019

(65) Prior Publication Data
US 2020/0052547 A1 Feb. 13, 2020

(30) Foreign Application Priority Data

Aug. 10, 2018 (KR) .......................... 10-2018-0093498

(51) Int. Cl.
*H02K 5/22* (2006.01)
*H02K 11/33* (2016.01)
(Continued)

(52) U.S. Cl.
CPC ............. *H02K 5/225* (2013.01); *H01R 12/53* (2013.01); *H01R 12/58* (2013.01); *H02K 11/33* (2016.01);
(Continued)

(58) Field of Classification Search
CPC ..... H02K 5/225; H02K 11/33; H02K 2111/03; H05K 5/0069; H05K 5/0247
(Continued)

(56) References Cited

U.S. PATENT DOCUMENTS 8,240,163 B2 * 8/2012 Watanabe ............... F04B 35/04
62/239
9,359,004 B2 * 6/2016 Kawata ................ B62D 5/0463
(Continued)

FOREIGN PATENT DOCUMENTS

CN 102484409 A * 6/2012 ............. H02K 5/225
CN 102834977 B * 6/2016 ......... F04D 25/0693
(Continued)

OTHER PUBLICATIONS

EPO Search Report dated Dec. 12, 2019 in corresponding patent application No. 19190171.9.

*Primary Examiner* — Peter G Leigh
(74) *Attorney, Agent, or Firm* — Norton Rose Fulbright US LLP; James R. Crawford

(57) ABSTRACT

The present invention may provide a motor comprising an inverter housing in which a substrate is disposed, a connector which is mounted on the inverter housing and electrically connects the substrate and a cable and wherein the connector includes a body and a first terminal coupled to the body, one side of the first terminal is in electrical contact with the substrate, the other side of the first terminal is in contact with the cable, wherein the inverter housing includes a connector mounting portion which accommodate the body of the connector, sealing members seal a gap between the connector mounting portion and the connector.

17 Claims, 14 Drawing Sheets

(51) Int. Cl.
*H01R 12/53* (2011.01)
*H01R 12/58* (2011.01)
*H05K 5/00* (2006.01)
*H05K 5/02* (2006.01)

(52) U.S. Cl.
CPC ......... *H05K 5/0069* (2013.01); *H05K 5/0247* (2013.01); *H02K 2211/03* (2013.01)

(58) Field of Classification Search
USPC .......................................................... 310/17
See application file for complete search history.

(56) References Cited

U.S. PATENT DOCUMENTS

| | | | | |
|---|---|---|---|---|
| 9,583,990 | B2* | 2/2017 | Tokunaga | ................ H02K 3/38 |
| 2002/0117914 | A1 | 8/2002 | Doi et al. | |
| 2016/0036305 | A1* | 2/2016 | Kawata | ................... H02P 25/22 |
| | | | | 180/443 |
| 2017/0201148 | A1* | 7/2017 | Haga | ...................... H02K 5/225 |
| 2017/0222497 | A1* | 8/2017 | Yu | ......................... H02K 3/522 |
| 2018/0048218 | A1* | 2/2018 | Im | ............................ H02K 5/10 |

FOREIGN PATENT DOCUMENTS

| | | | | |
|---|---|---|---|---|
| CN | 106099455 | A | 11/2016 | |
| CN | 104081610 | B * | 4/2017 | ............ B60L 3/0069 |
| CN | 107040056 | A * | 8/2017 | ............... H02K 1/12 |
| CN | 104218699 | B * | 3/2018 | |
| DE | 102011122016 | B4 * | 5/2014 | ............ B60L 50/20 |
| DE | 102017212238 | A1 * | 2/2018 | ............ H02K 11/33 |
| EP | 3609054 | A1 * | 2/2020 | ............ H01R 12/53 |
| JP | 2005-117708 | A | 4/2005 | |
| JP | 2016194197 | A * | 11/2016 | ............ H01R 12/53 |
| KR | 20170078206 | A | 7/2017 | |
| KR | 20180018282 | A | 2/2018 | |
| WO | WO-2012008135 | A1 * | 1/2012 | ............ H02K 11/33 |

* cited by examiner

WATERPROOF WITH INVERTER HOUSING HAVING CONNECTOR MOUNTING PORTION FOR ACCOMMODATING SEALING MEMBERS

This application claims priority from Korean Patent Application No, 10-2018-0093498 filed on Aug. 10, 2018, The entire contents of this application is incorporated herein by reference in its entirety.

BACKGROUND

1. Field of the Invention

The present invention relates to a motor.

2. Discussion of Related Art

A motor includes a rotor and a stator. In addition, the motor may be integrally formed with an inverter. A substrate is disposed in the inverter, and the substrate is connected to a cable through a connector. Such a motor may be used as a driving source to drive a cooling fan of a vehicle. In this case, the rotor of the motor may be disposed outside the stator.

Japanese Patent Application Laid-Open No. 2005-117708 (Apr. 4, 2005, hereinafter called a present document) discloses a motor integrated with an inverter.

In the motor of the present document, a connector mounting portion for mounting a connector on an inverter housing is provided. A plurality of sealing members are used in the connector mounting portion, or a body of the connector is formed in a grommet type which is elastically deformed for a watertight seal of a gap between the inverter housing and the connector or a gap between the connector and the cable.

However, the motor has problems in that a mounting structure for mounting the connector on the inverter housing is complex, and an assembly operation of electrically connecting the connector to the substrate is very difficult.

SUMMARY OF THE INVENTION

The present invention is directed to providing a motor which is easily assembled and has improved sealability.

Objectives to be solved by embodiments are not limited to the above-described objective and other objectives will be clearly understood by those skilled in the art through the embodiments described below.

According to an aspect of the present invention, there is provided a motor including an inverter housing in which a substrate is disposed, a connector which is mounted on the inverter housing and electrically connects the substrate and a cable and wherein the connector includes a body and a first terminal coupled to the body, one side of the first terminal is in electrical contact with the substrate, the other side of the first terminal is in contact with the cable, wherein the inverter housing includes a connector mounting portion which accommodate the body of the connector, sealing members seal a gap between the connector mounting portion and the connector.

The connector mounting portion may include an accommodation groove concavely formed in a bottom surface of the connector mounting portion.

The body may include a hole, the hole and the accommodation groove are disposed to be aligned with each other, the hole and the accommodation groove are filled with the sealing members to seal and a gap between the body and the cable.

The first terminal may be directly coupled and electrically connected to the substrate.

The substrate may include a plurality of pinholes connected to conductive patterns, the first terminal may include first terminal bodies which are coupled to the body and first end portions which extend from the first terminal bodies, and the first end portions may be inserted into the pinholes and electrically connected to the conductive patterns.

The first end portions may be disposed to be bent upward from the first terminal bodies, and a size of at least one of the plurality of first end portions may be different from those of other first end portions.

A lower surface of the substrate may be disposed at a higher level than the first terminal bodies.

At least one of the plurality of first end portions may include a stepped surface in contact with the substrate.

The substrate may include a second terminal in surface contact with the first terminal.

The first terminal may include a first terminal body coupled to the body and a first end portion which extends from the first terminal body, a second terminal may include a second terminal body coupled to the substrate and a second end portion which extends from the second terminal body, the first end portion may be disposed to be bent upward from the first terminal body, and the second end portion may be disposed to be bent upward from the second terminal body.

The hole may include a first hole and a second hole which is disposed inward from the first hole in the inverter housing.

The body may include a first part and a second part which are connected with the first hole disposed therebetween, the first part may be coupled to the first terminal, and the cable may be disposed to pass through the second part.

The second part may include the second hole.

The body of the connector may be slidably connected to the connector mounting portion.

The connector mounting portion may include a guide which protrudes from a sidewall of the connector mounting portion, and the connector may include a slot disposed in a side surface of the body and slidably connected to the guide.

The accommodation groove may include a first accommodation groove disposed under the first hole and a second accommodation groove disposed under the second hole, and the sealing member filling the first accommodation groove and the sealing member filling the second accommodation groove may be connected.

A first coupling hole may be disposed in the body, a second coupling hole may be disposed in the connector mounting portion, and the body is coupled to the inverter housing by coupling members coupled to the first coupling hole and the second coupling hole.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, exemplary embodiments of the present invention will be described in detail with reference to the accompanying drawings. Purposes, specific advantages, and novel features of the invention will be made clear from the exemplary embodiments and the following detailed description in connection with the accompanying drawings. In the description of the invention, when it is determined that detailed descriptions of related well-known functions unnecessarily obscure the gist of the invention, the detailed descriptions thereof will be omitted.

It will be understood that, although the terms "first," "second," etc. may be used herein to describe various elements, these elements should not be limited by these terms. These terms are only used to distinguish one element from another element. For example, a first element could be termed a second element, and the second element could similarly be termed the first element without departing from the scope of the present invention. As used herein, the term "and/or" includes combinations or any one of a plurality of associated listed items.

Figure 1:
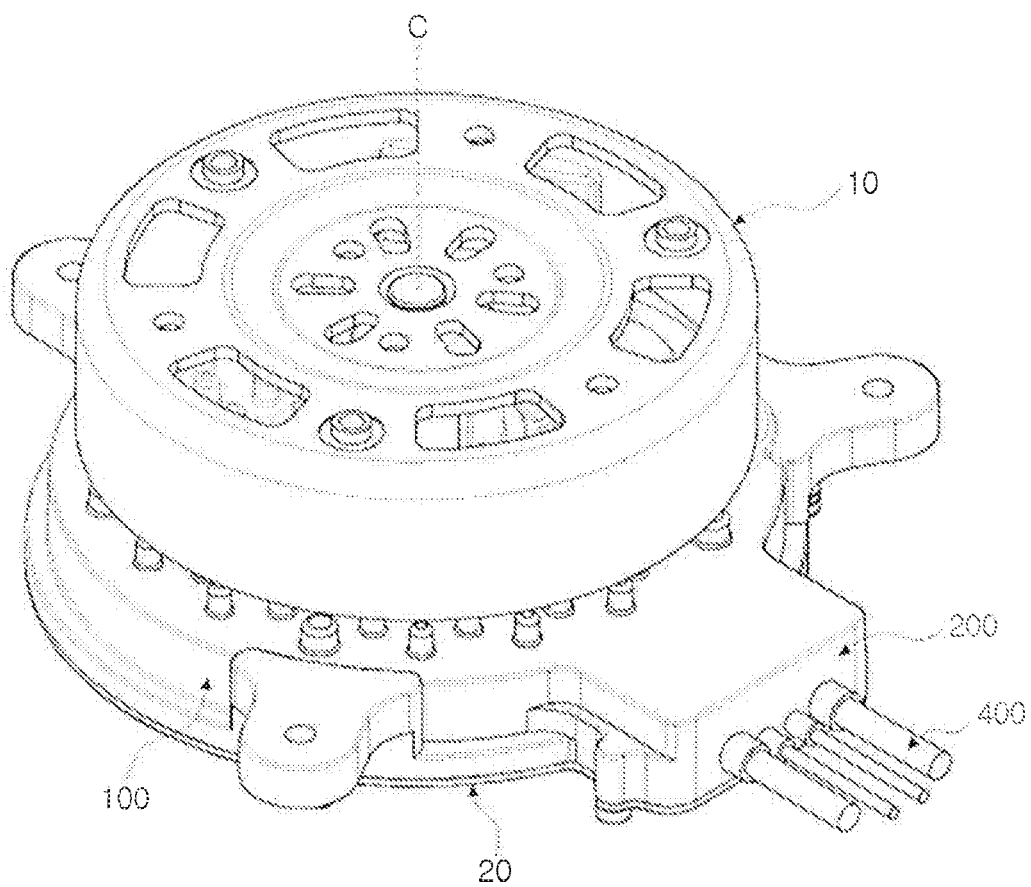
FIG. 1 is a view illustrating a motor according to an embodiment.
Figure 2:
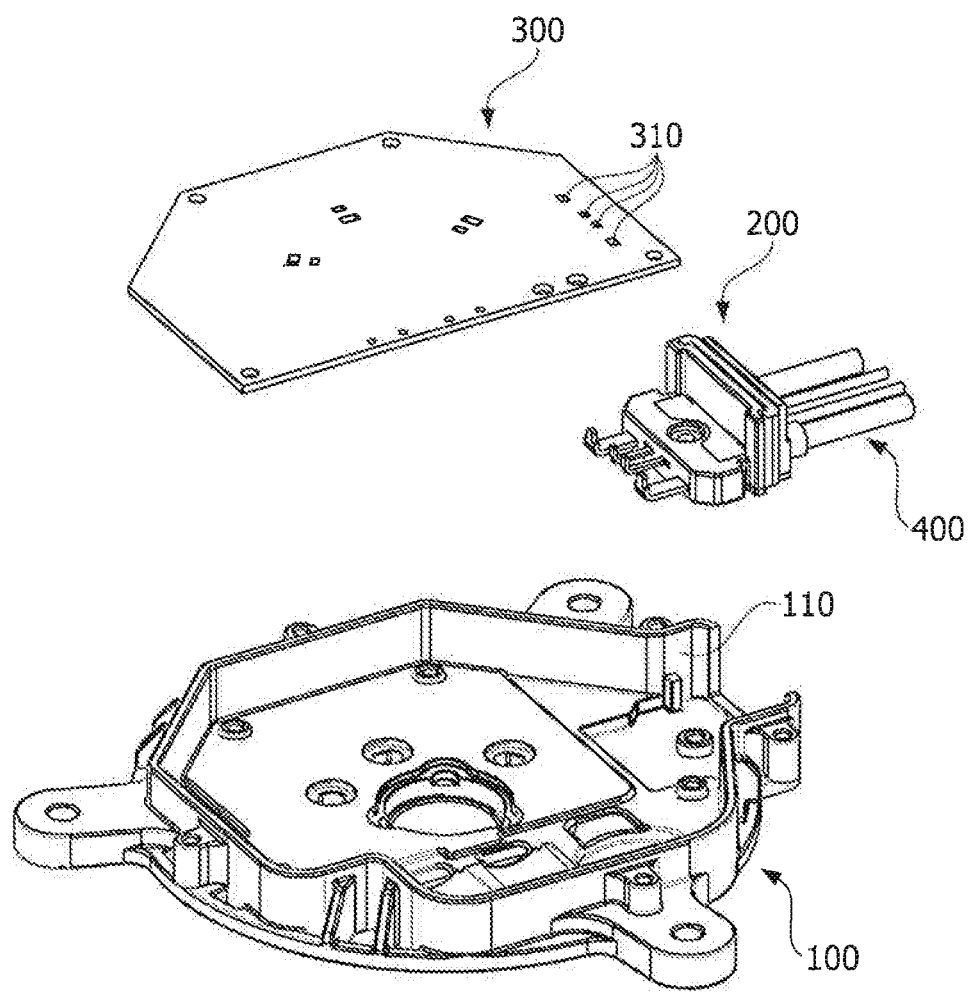
FIG. 2 is a view illustrating an interior of an inverter housing illustrated in FIG. 1.

FIG. 1 is a view illustrating a motor according to an embodiment, and FIG. 2 is a view illustrating an interior of an inverter housing illustrated in FIG. 1. Hereinafter, a vertical direction denotes a direction parallel to a shaft direction of the motor.

Referring to FIGS. 1 and 2, the motor according to the embodiment includes an inverter housing 100 and a connector 200. A motor part 10 may be disposed on the inverter housing 100. Although not illustrated in the drawings, a shaft part may be disposed in the inverter housing 100, and a rotor of the motor may be rotatably coupled to the shaft part. A stator may be disposed inside the rotor. In the motor according to the embodiment, since the shaft part is disposed in the inverter housing 100, an inverter connected to the rotor may be integrated with the motor part 10. The stator may be coupled to an outer circumferential surface of the shaft part. The rotor rotates about a center C of a shaft. Meanwhile, a magnet may be attached to an inner circumferential surface of the rotor. A lower side of the inverter housing 100 is open, and the open lower side of the inverter housing 100 may be covered by a cover 20. Meanwhile, the inverter housing 100 may include a connector mounting portion 110.

The connector 200 is mounted on the connector mounting portion 110 of the inverter housing 100.

Cables 400 are connected to the connector 200.

A substrate 300 is disposed inside the inverter housing 100. The substrate 300 is electrically connected to the connector 200.

Figure 3:
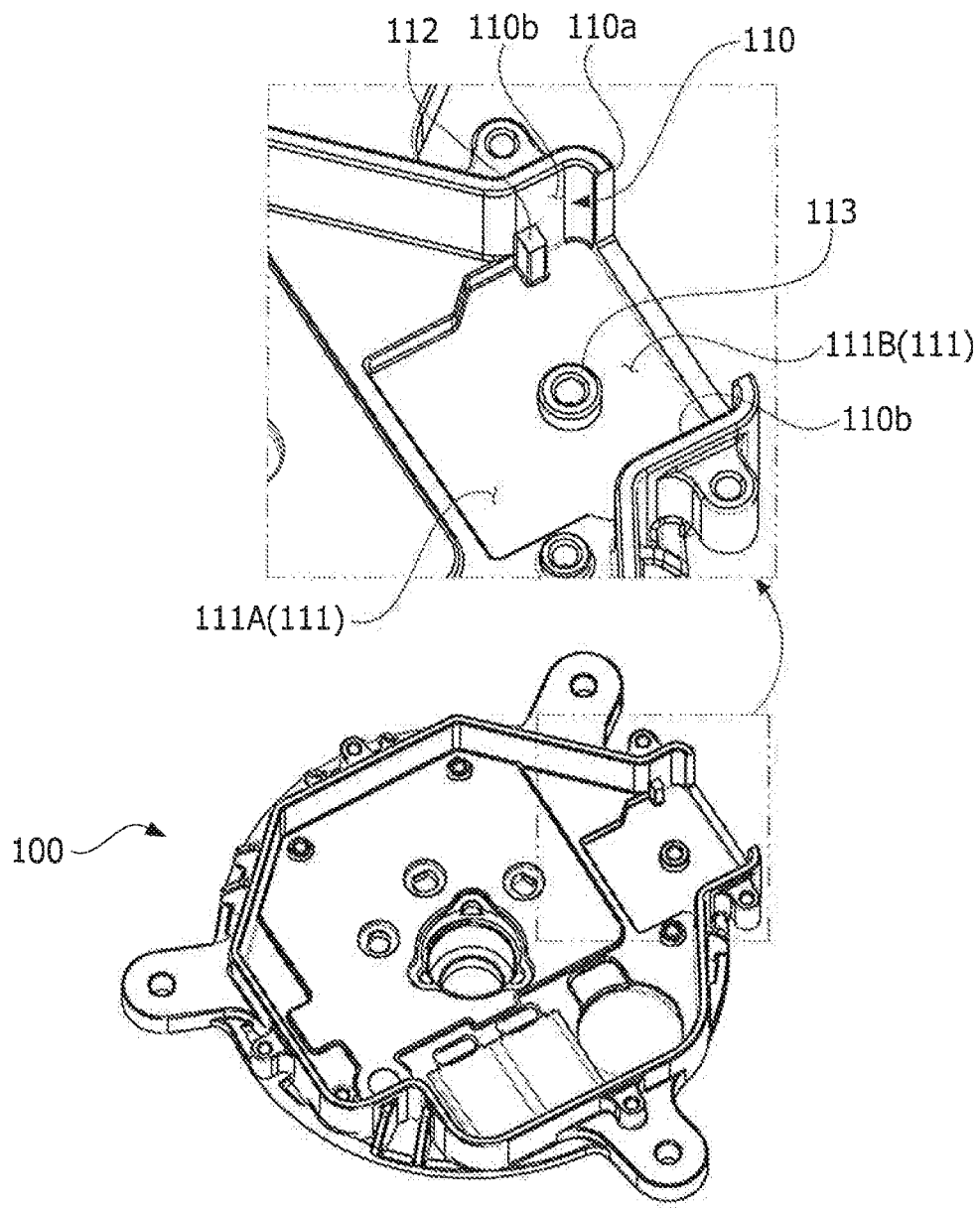
FIG. 3 is a view illustrating a connector mounting portion and an accommodation groove of the inverter housing illustrated in FIG. 1.

FIG. 3 is a view illustrating the connector mounting portion 110 and an accommodation groove 111 of the inverter housing 100 illustrated in FIG. 1

Referring to FIGS. 2 and 3, the inverter housing 100 includes the connector mounting portion 110 and the accommodation groove 111. The connector mounting portion 110 accommodates the connector 200 therein. The connector mounting portion 110 may be formed to extend outward from the inverter housing 100. The accommodation groove 111 is concavely formed in a bottom surface of the connector mounting portion 110. The accommodation groove 111 is for additionally securing a space to be filled with sealing members 230.

The connector mounting portion 110 has a space that is defined by a boundary including both sidewalls 110b and an inlet 110a and accommodates the connector 200 therein. In addition, the inlet 110a of the connector mounting portion 110 may have a form in which a part of the sidewall 110b of the inverter housing 100 is cut. Guides 112 may be disposed to protrude from the both sidewalls 110b of the connector mounting portion 110. The guides 112 may be disposed to extend in a height direction of the inverter housing 100. Meanwhile, the connector mounting portion 110 may include a second coupling hole 113. The second coupling hole 113 is for coupling the connector 200 to the inverter housing 100.

The accommodation groove 111 is concavely formed in the bottom surface of the connector mounting portion 110. The accommodation groove 111 is a groove for additionally securing a space to be filled with the sealing members 230 in order to more thoroughly fill a gap between the connector 200 and the inverter housing 100 with the sealing members 230.

The accommodation groove 111 may be divided into a first accommodation groove 111A and a second accommodation groove 111B. The first accommodation groove 111A is disposed outward from the guides 112 of the connector mounting portion 110, and the second accommodation portion is disposed inward from the guides 112.

Figure 4:
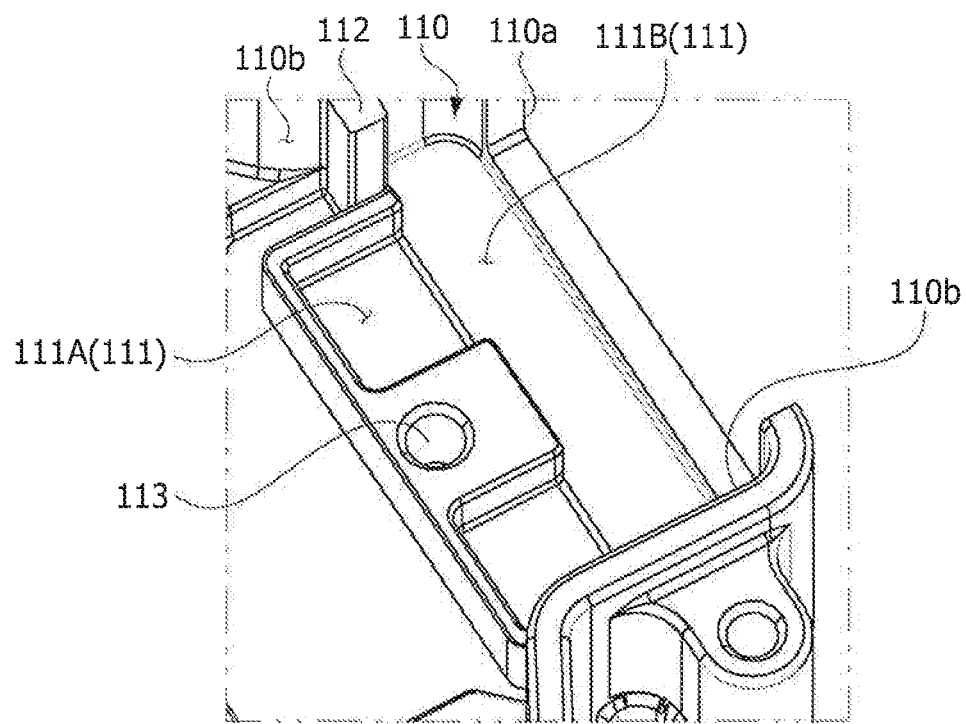
FIG. 4 is a view illustrating another example of an accommodation groove.

FIG. 4 is a view illustrating another example of an accommodation groove 111.

Referring to FIG. 4, a first accommodation groove 111A may be disposed at a higher level than a second accommodation groove 111B. Accordingly, the first accommodation groove 111A and the second accommodation groove 111B may be divided in a stepped manner. Such a structure is a structure in which a contact area between a sealing member 230 and an inverter housing 100 increases, a step structure is formed, and thus air tightness of the inverter housing 100 is further improved.

Figure 5:
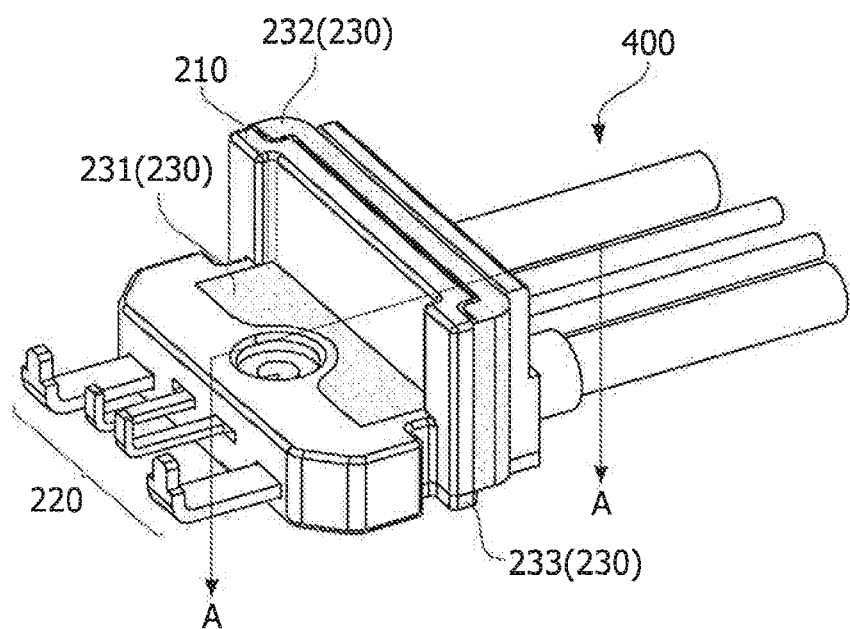
FIG. 5 is a view illustrating a connector of a motor according to a first embodiment.
Figure 6:
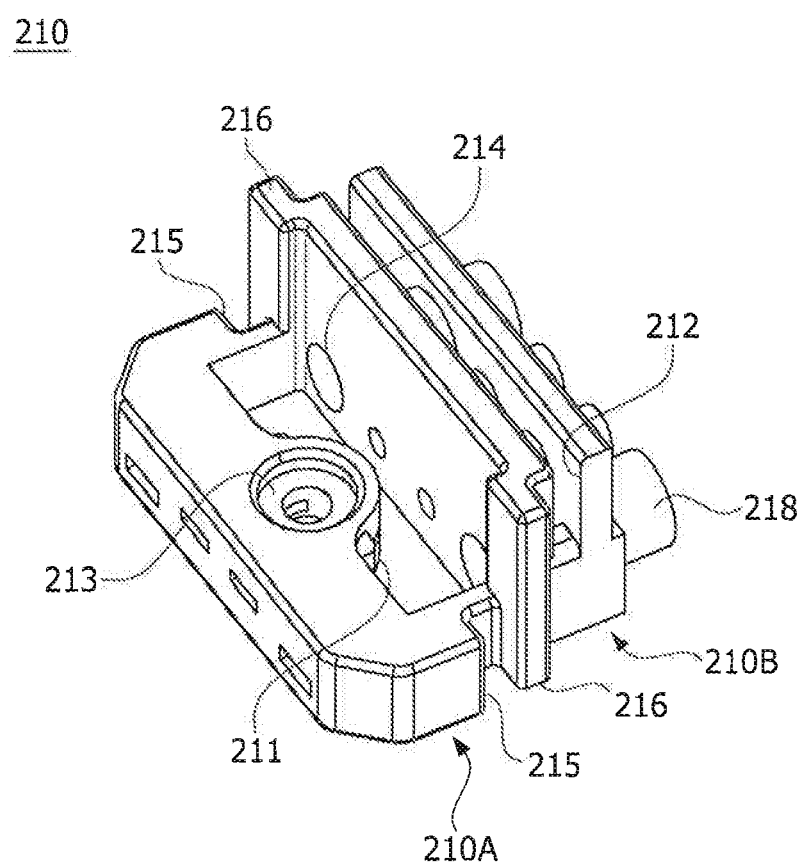
FIG. 6 is a view illustrating a body of the connector illustrated in FIG. 5.

FIG. 5 is a view illustrating a connector 200 of a motor according to a first embodiment, and FIG. 6 is a view illustrating a body 210 of the connector 200 illustrated in FIG. 5;

A motor may be classified as the motor according to the first embodiment or a motor according to a second embodiment on the basis of a structure in which a substrate 300 is connected to a connector 200. First, the motor according to the first embodiment has a feature in which a connector 200 and a substrate 300 are directly connected.

Referring to FIGS. 5 and 6, the connector 200 may include a body 210 and first terminals 220.

The body 210 may include a first part 210A and a second part 210B. The first part 210A and the second part 210B are connected with a first hole 211 disposed therebetween. The first part 210A is coupled to the first terminals 220. The second part 210B is connected to cables 400. A second hole 212 is disposed in the second part 210B. The first hole 211 and the second hole 212 are formed to pass through the body 210 in a vertical direction. The first hole 211 and the second hole 212 are filled with sealing members 230.

A first coupling hole 213 is disposed in the first part 210A. The first coupling hole 213 is for coupling the connector 200 to an inverter housing 100. When the connector 200 is mounted on a connector mounting portion 110 of the inverter housing 100, the first coupling hole 213 and a second coupling hole 113 are aligned. A coupling member such as a bolt is coupled to the first coupling hole 213 and the second coupling hole 113 so as to couple the inverter housing 100 to the connector 200.

Cable holes 214 are disposed in the second part 210B. The cables 400 are disposed to be inserted into the cable holes 214. The cable holes 214 may be disposed to communicate with the first hole 211.

Slots 215 may be disposed in side surfaces of the body 210. The slots 215 are concavely formed in the side surfaces of the body 210. In addition, the slots 215 are disposed to extend in a vertical direction. In a process in which the connector 200 is mounted on the connector mounting portion 110, the guides 112 are slidably coupled to the slots 215. The body 210 of the connector 200 is guided to the connector mounting portion 110 by the slots 215 and the guides 112.

Cable insertion portions 218 which communicate with the cable holes 214 and into which the cables 400 are inserted may be disposed in a rear surface of the second part 210B.

Figure 7:
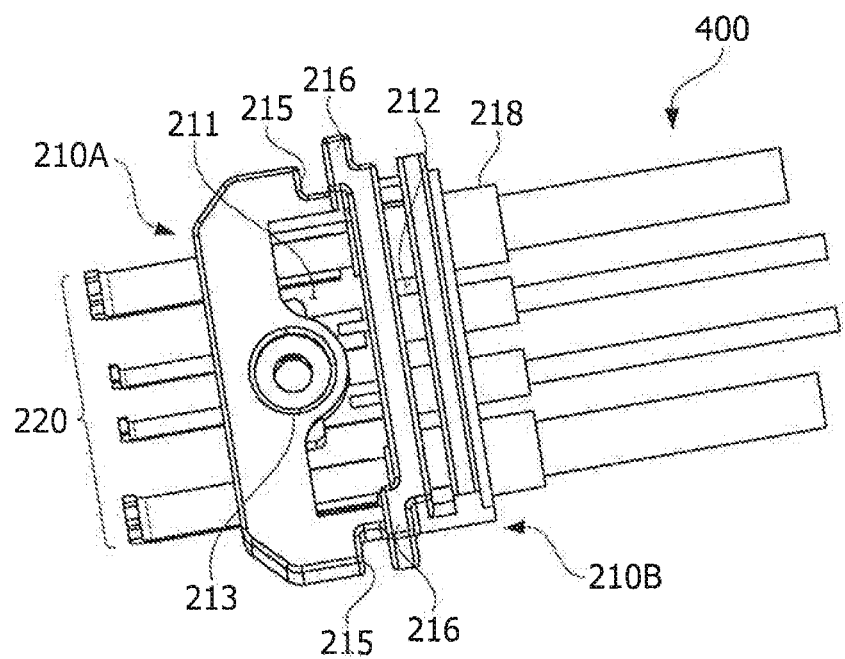
FIG. 7 is a plan view illustrating the connector in a state in which the first terminals and the cables are connected.

FIG. 7 is a plan view illustrating the connector 200 in a state in which the first terminals 220 and the cables 400 are connected.

Referring to FIG. 7, one end portions of the first terminals 220 are connected to the substrate 300 (see FIG. 9), and the other end portions of the first terminals 220 are connected to the cables 400. The other end portions of the first terminals 220 protrude from the first part 210A to be disposed in the first hole 211. The other end portions of the first terminals 220 are connected to the cables 400 in the first hole 211. The second hole 212 is disposed behind the first hole 211.

Figure 8:
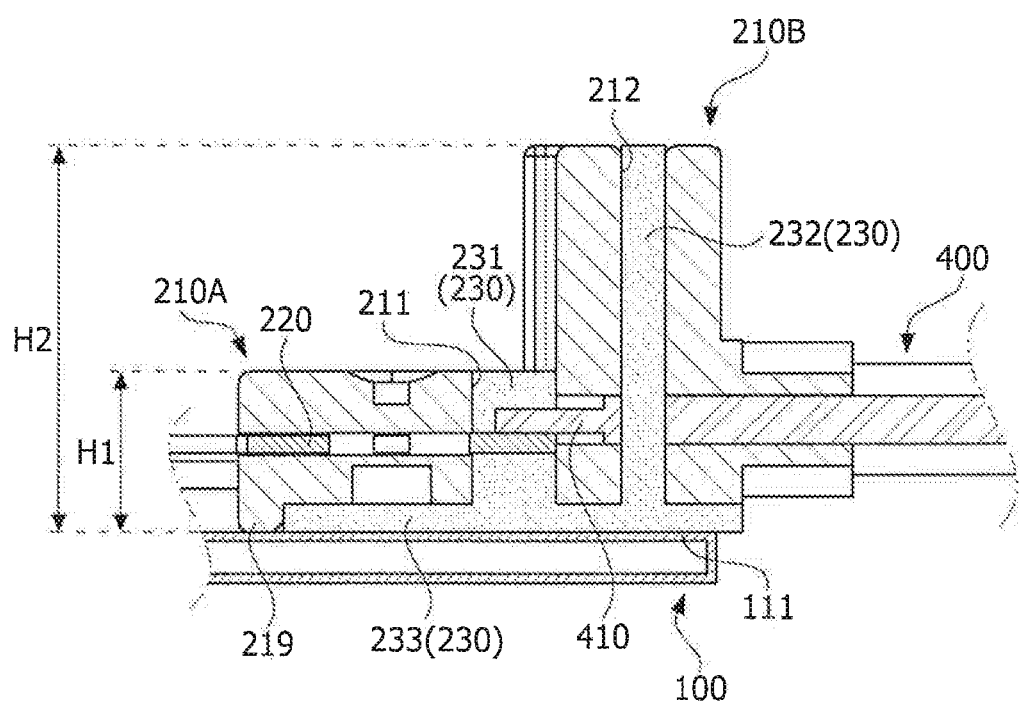
FIG. 8 is a cross-sectional view illustrating the connector taken along line A-A of FIG. 5.

FIG. 8 is a cross-sectional view illustrating the connector 200 taken along line A-A of FIG. 5.

Referring to FIGS. 3, 5, 6, and 8, the sealing members 230 may include a first sealing part 231, a second sealing part 232, and a third sealing part 233.

When the connector mounting portion 110 is coupled to the connector 200, a first accommodation groove 111A of the inverter housing 100 is disposed to be aligned with a lower side of the first hole 211 of the connector 200. A second accommodation groove 111B of the inverter housing 100 is disposed to be aligned with a lower side of the second hole 212 of the connector 200.

When the first hole 211 is filled with the sealing member 230, the first sealing part 231 is formed. The first sealing part 231 serves to fill gaps between the cable holes 214 and the cables 400. In addition, the first sealing part 231 serves to surround and protect contact portions between end portions of the first terminals 220 and the cables 400.

When the second hole 212 is filled with the sealing member 230, the second sealing part 232 is formed. The second sealing part 232 serves to fill a gap between the connector mounting portion 110 and the body 210 of the connector 200.

Meanwhile, the sealing member 230 filling the first hole 211 flows down to the first accommodation groove 111A due to a weight thereof. In addition, the sealing member 230 filling the second hole 212 flows down to the second accommodation groove 111B due to the weight thereof. The sealing members 230 which flow down are accommodated in the first accommodation groove 111A and the second accommodation groove 111B to form the third sealing part 233. The third sealing part 233 is connected to the first sealing part 231 and the second sealing part 232. The third sealing part 233 serves to fill a gap between the lower surface of the body 210 of the connector 200 and the inverter housing 100. The accommodation groove 111 is concavely formed to be stepped from a bottom surface of the inverter housing 100. Accordingly, the third sealing part 233 formed due to the accommodation groove 111 may thoroughly fill the gap which may be formed between the lower surface of the body 210 of the connector 200 and the inverter housing 100. This provides an advantage in that overall air tightness of the inverter housing 100 can be improved.

Referring to FIG. 8, a rib 219 may be disposed to protrude from the lower surface of the body 210. The rib 219 is in contact with the third sealing part 233. The rib 219 increases a contact area of the third sealing part 233. The rib 219 serves to reduce movement of the connector 200 when the connector 200 is shaken when the cables 400 are pulled or vibrate.

Figure 9:
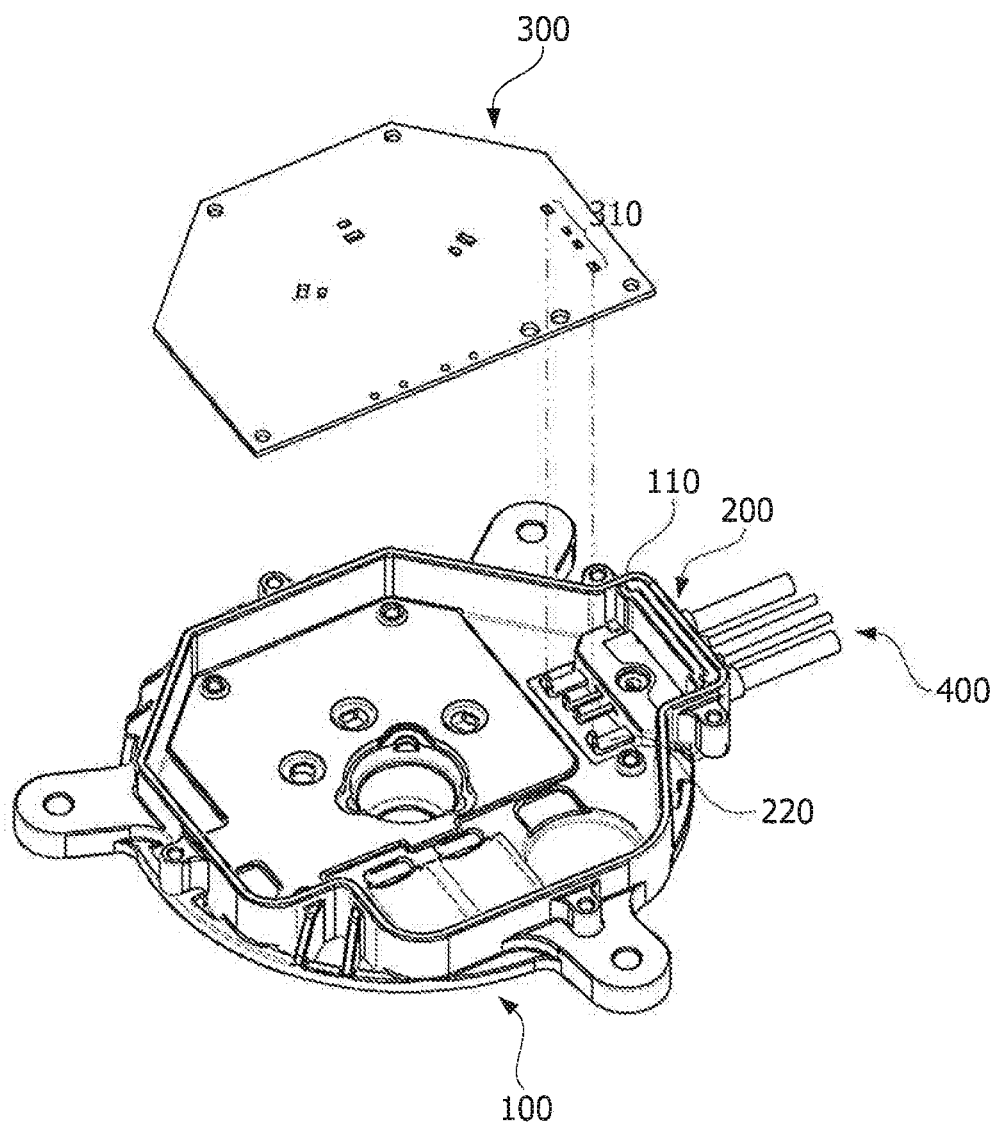
FIG. 9 is a perspective view illustrating an assembly process of a substrate.

FIG. 9 is a perspective view illustrating an assembly process of the substrate 300.

Referring to FIG. 9, the connector 200 is directly coupled to the substrate 300. Specifically, a plurality of pinholes 310 may be disposed in the substrate 300. Conductive patterns of the substrate 300 are connected to the pinholes 310. The first terminals 220 are inserted into the pinholes 310 and are electrically connected to the substrate 300.

Figure 10:
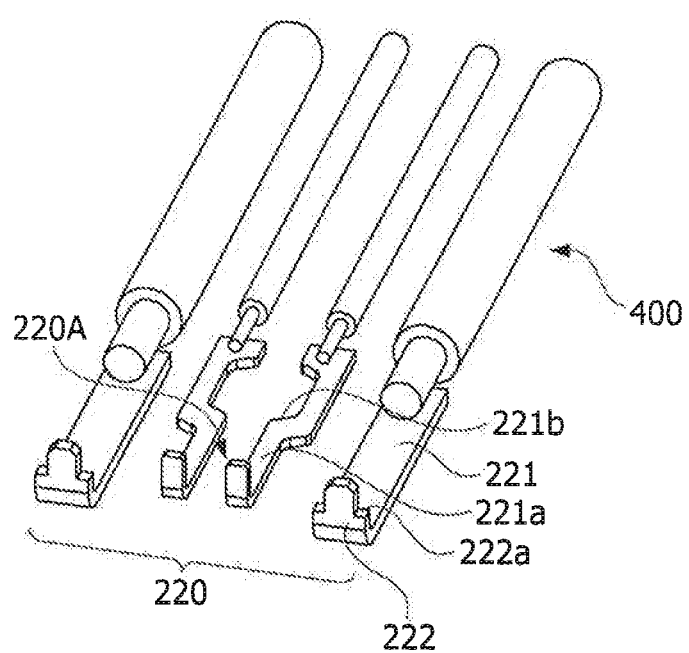
FIG. 10 is a view illustrating an arrangement state of the first terminals.

FIG. 10 is a view illustrating an arrangement state of the first terminals 220.

Referring to FIG. 10, the first terminals 220 may include first terminal bodies 221 and first end portions 222. The first terminal bodies 221 may have a plate shape formed to extend in a lateral direction. One end portions of the terminal bodies are in contact with the cables 400. The first end portions 222 are disposed to be bent upward from the other end portions of the first terminal bodies 221. The first end portions 222 are inserted into the pinholes 310 of the substrate 300.

The plurality of first terminals 220 may be disposed to be arranged in parallel. At least one of the first end portions 222 of the plurality of first terminals 220 may have a size which is different from that of other first end portions 222. In addition, a stepped surface 222a may be disposed at least one of the first end portions 222 of the plurality of first terminals 220. The stepped surface 222a of the first end portion 222 is in contact with a lower surface of the substrate 300 when the substrate 300 is inserted into the inverter housing 100 on the first end portion 222. The stepped surface 222a serves as a stopper which prevents the substrate 300 from being pressed anymore after the first end portions 222 are inserted into the pinholes 310 when the substrate 300 is pressed down to insert the first end portions 222 into the pinholes 310.

Figure 11:
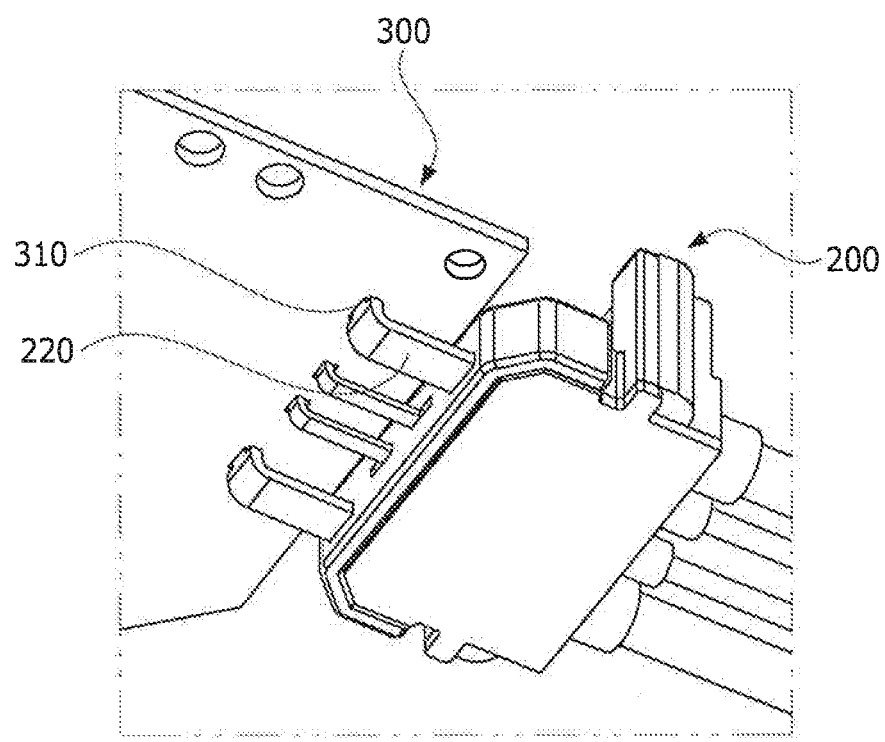
FIG. 11 is a bottom view illustrating the substrate and the connector in a state in which the substrate and the connector are connected.
Figure 12:
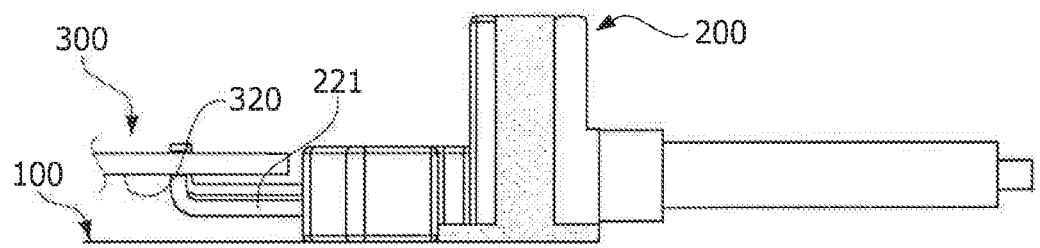
FIG. 12 is a plan view illustrating the substrate and the connector in a state in which the substrate and the connector are connected.

Bent portions 221b may be formed in first terminal bodies 221a of first terminals 220A, which are disposed adjacent to the first coupling hole 213 disposed in the body 210 of the connector 200, among the plurality of first terminals 220. The bent portions 221b are for securing a space of the first coupling hole 213, FIG. 11 is a bottom view illustrating the substrate 300 and the connector 200 in a state in which the substrate 300 and the connector 200 are connected, and FIG. 12 is a plan view illustrating the substrate 300 and the connector 200 in a state in which the substrate 300 and the connector 200 are connected.

Referring to FIGS. 8, 9, 11, and 12, in a state in which the connector 200 is mounted on the inverter housing 100, the substrate 300 is assembled with the first terminals 220. Accordingly, in an assembly process, it is easy to adjust the gaps between the substrate 300 and the first terminals 220.

Since the substrate 300 is assembled on the connector 200, a lower surface of the substrate 300 is disposed at a higher level than the first terminal bodies 221. In addition, as illustrated in FIG. 8, a height H1 of the first part 210A of the body 210 is less than a height H2 of the second part 210B.

A connector 200 according to the second embodiment has a feature in which first terminals 240 of the connector 200 are electrically connected to second terminals 320 disposed in a substrate 300.

Figure 13:
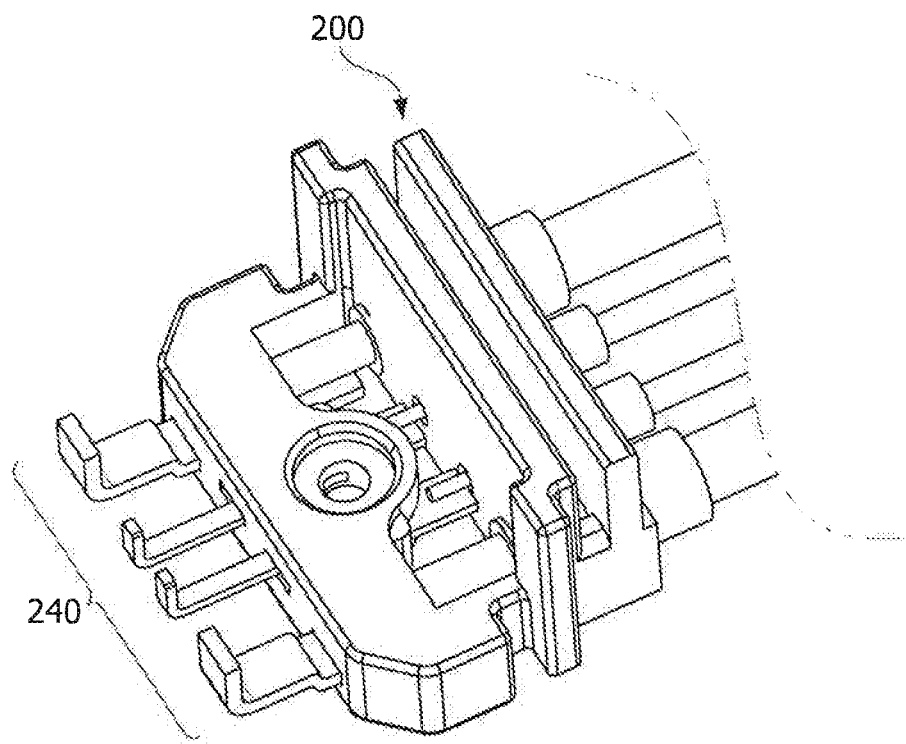
FIG. 13 is a view illustrating the connector 200 of the motor according to the second embodiment.
Figure 14:
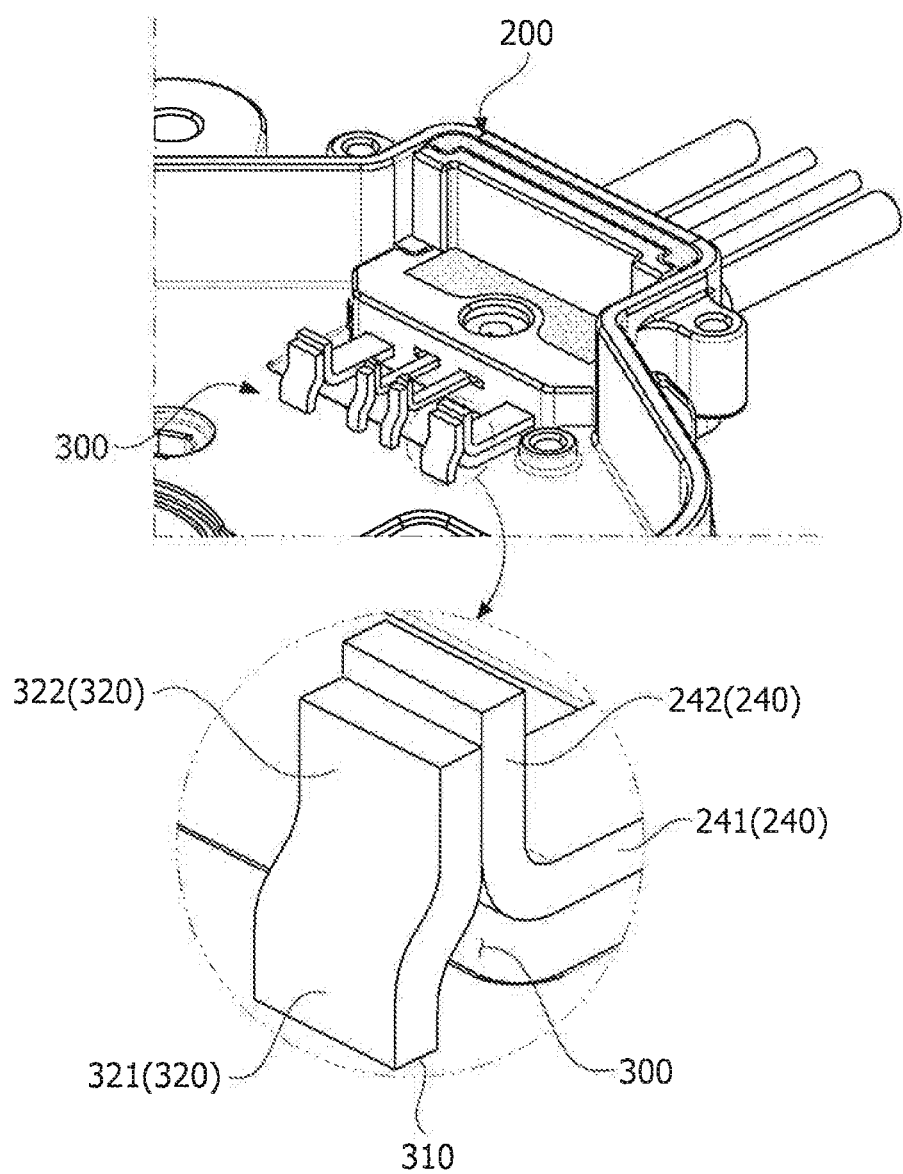
FIG. 14 is a view illustrating a state in which the first terminals 240 and the second terminals 320 are coupled.

FIG. 13 is a view illustrating the connector 200 of the motor according to the second embodiment, and FIG. 14 is a view illustrating a state in which the first terminals 240 and the second terminals 320 are coupled.

Referring to FIG. 13, the connector 200 of the motor according to the second embodiment includes the first terminals 240. In addition, the substrate 300 includes the second terminals 320. The first terminals 240 may include first terminal bodies 221 and first end portions 222. The first end portions 222 may are disposed to be bent upward from end portions of the first terminal bodies 221.

The second terminals 320 may include second terminal bodies 321 and second end portions 322. The second end portions 322 are disposed to be bent upward from one end portions of the second terminal bodies 321. The other end portions of the second terminal bodies 321 are coupled to the substrate 300. The first end portions 222 and the second end portions 322 are coupled by welding in a state in which the first end portions 222 and the second end portions 322 are in surface contact with each other.

According to the embodiments of the present invention, a motor is provided with advantageous effects in that assembly is easy and sealability is improved.

Since a terminal for connecting a substrate to a connector can be removed from the substrate, an advantageous effect is provided in which a manufacturing cost and the number of manufacturing processes are reduced.

Since a body of the connector is mounted on a motor housing and then the substrate is assembled, an advantageous effect is provided in which assemblability for connecting the substrate to the connector is improved.

Since a gap between a lower surface of a body of the connector and the motor housing is filled with a sealing member, an advantageous effect is provided in that sealability of the motor housing is improved.

As described above, the motor according to exemplary embodiments of the present invention has been specifically described with the accompanying drawings.

That is, the above-described embodiments of the present invention should be considered in a descriptive sense only and not for purposes of limitation. The scope of the present invention is defined not by the detailed description but by the appended claims, and encompasses all modifications and alterations derived from meanings and the scope and equivalents of the appended claims.

What is claimed is:

1. A motor comprising:
an inverter housing in which a substrate is disposed;
a connector which is mounted on the inverter housing and electrically connects the substrate and a cable; and
wherein the connector includes a body and a first terminal coupled to the body,
one side of the first terminal is in electrical contact with the substrate,
the other side of the first terminal is in contact with the cable,
wherein the inverter housing includes a connector mounting portion which accommodate the body of the connector,
wherein the body include a first hole and a second hole,
wherein the sealing members include a first sealing part, a second sealing part and a third sealing part,
wherein the first sealing part is disposed in the first hole part and seal contact portions between the first terminals and the cables,
wherein the second sealing part passes through the second hole, and is filled to the receiving groove concavely formed in a bottom surface of the connector mounting portion and seal between the inverter housing and the body,
wherein the connector mounting portion includes the accommodation groove concavely formed in a bottom surface of the connector mounting portion,
wherein the third sealing part filling the accommodation groove is connected to the first sealing part and the second sealing part and is fill the gap which is formed between the lower surface of the body of the connector and the inverter housing.

2. The motor of claim 1, wherein the connector mounting portion includes an accommodation groove concavely formed in a bottom surface of the connector mounting portion.

3. The motor of claim 2, wherein the body includes a hole, the hole and the accommodation groove are disposed to be aligned with each other, the hole and the accommodation groove are filled with the sealing members to seal and a gap between the body and the cable.

4. The motor of claim 3, wherein:
the substrate includes a plurality of pinholes connected to conductive patterns;
the first terminal includes first terminal bodies which are coupled to the body and first end portions which extend from the first terminal bodies; and
the first end portions are inserted into the pinholes and electrically connected to the conductive patterns.

5. The motor of claim 4, wherein:
the first end portions are disposed to be bent upward from the first terminal bodies; and
a size of at least one of the plurality of first end portions is different from those of other first end portions.

6. The motor of claim 5, wherein a lower surface of the substrate is disposed at a higher level than the first terminal bodies.

7. The motor of claim 6, wherein at least one of the plurality of first end portions include a stepped surface in contact with the substrate.

8. The motor of claim 1, wherein the first terminal is directly coupled and electrically connected to the substrate.

9. The motor of claim 1, wherein the substrate includes a second terminal in surface contact with the first terminal.

10. The motor of claim 1, wherein the body of the connector is slidably connected to the connector mounting portion.

11. A motor comprising:
an inverter housing in which a substrate is disposed;
a connector which is mounted on the inverter housing and electrically connects the substrate and a cable; and
wherein the connector includes a body and a first terminal coupled to the body,
one side of the first terminal is in electrical contact with the substrate,
the other side of the first terminal is in contact with the cable,
wherein the inverter housing includes a connector mounting portion which accommodate the body of the connector,
sealing members seal a gap between the connector mounting portion and the connector,
wherein the substrate includes a second terminal in surface contact with the first terminal,
wherein the first terminal includes a first terminal body coupled to the body and a first end portion which extends from the first terminal body;
wherein the second terminal includes a second terminal body coupled to the substrate and a second end portion which extends from the second terminal body;
the first end portion is disposed to be bent upward from the first terminal body; and
the second end portion is disposed to be bent upward from the second terminal body.

12. A motor comprising:
an inverter housing in which a substrate is disposed;
a connector which is mounted on the inverter housing and electrically connects the substrate and a cable; and
wherein the connector includes a body and a first terminal coupled to the body,
one side of the first terminal is in electrical contact with the substrate,
the other side of the first terminal is in contact with the cable,
wherein the inverter housing includes a connector mounting portion which accommodate the body of the connector,
sealing members seal a gap between the connector mounting portion and the connector,
wherein the connector mounting portion includes an accommodation groove concavely formed in a bottom surface of the connector mounting portion,
wherein the body includes a hole,
wherein the hole and the accommodation groove are disposed to be aligned with each other, the hole and the accommodation groove are filled with the sealing members to seal and a gap between the body and the cable,
wherein the hole includes a first hole and a second hole which is disposed inward from the first hole in the inverter housing.

13. The motor of claim 12, wherein:
the body includes a first part and a second part which are connected with the first hole disposed therebetween;
the first part is coupled to the first terminal; and
the cable is disposed to pass through the second part.

14. The motor of claim 13, wherein the second part includes the second hole.

15. The motor of claim 14, wherein:
the connector mounting portion includes a guide which protrudes from a sidewall of the connector mounting portion; and
the connector includes a slot disposed in a side surface of the body and slidably connected to the guide.

16. The motor of claim 13, wherein:
the accommodation groove includes a first accommodation groove disposed under the first hole and a second accommodation groove disposed under the second hole; and
the sealing member filling the first accommodation groove and the sealing member filling the second accommodation groove are connected.

17. The motor of claim 13, wherein:
a first coupling hole is disposed in the body;
a second coupling hole is disposed in the connector mounting portion; and
the body is coupled to the inverter housing by coupling members coupled to the first coupling hole and the second coupling hole.

* * * * *

UNITED STATES PATENT AND TRADEMARK OFFICE
CERTIFICATE OF CORRECTION

| | |
|---|---|
| PATENT NO. | : 11,496,019 B2 |
| APPLICATION NO. | : 16/536453 |
| DATED | : November 8, 2022 |
| INVENTOR(S) | : Ho Bin Im et al. |

It is certified that error appears in the above-identified patent and that said Letters Patent is hereby corrected as shown below:

On the Title Page

Item (54) and in the Specification, Column 1, Line 1, REPLACE:
"WATERPROOF WITH INVERTER HOUSING HAVING CONNECTOR MOUNTING PORTION FOR ACCOMMODATING SEALING MEMBERS"

With:
--WATERPROOF MOTOR WITH INVERTER HOUSING HAVING CONNECTOR MOUNTING PORTION FOR ACCOMMODATING SEALING MEMBERS--.

Signed and Sealed this
Twenty-seventh Day of December, 2022

Katherine Kelly Vidal
*Director of the United States Patent and Trademark Office*